(12) United States Patent
Ryu et al.

(10) Patent No.: US 8,462,331 B2
(45) Date of Patent: Jun. 11, 2013

(54) LASER PROCESSING METHOD AND LASER PROCESSING APPARATUS

(75) Inventors: Beng So Ryu, Incheon (KR); Hong-Jin Jung, Gunpo-si (KR); Byong-Shik Lee, Gunpo-si (KR); Bum-Joong Kim, Anyang-si (KR); Hyeon-Sam Jang, Anyang-si (KR); Hark-Yong Kim, Anyang-si (KR); Jong-Ho Kwak, Seoul (KR); Young-Yong Kim, Namyangju (KR); Sun-Young Hong, Seoul (KR)

(73) Assignees: QMC Co., Ltd., Gyeonggi-do (KR); Beng So Ryu, Incheon (KR)

( * ) Notice: Subject to any disclaimer, the term of this patent is extended or adjusted under 35 U.S.C. 154(b) by 302 days.

(21) Appl. No.: 12/914,406

(22) Filed: Oct. 28, 2010

(65) Prior Publication Data

US 2012/0043474 A1 Feb. 23, 2012

(30) Foreign Application Priority Data

Aug. 18, 2010 (KR) .................. 10-2010-0079611

(51) Int. Cl.
*G01N 21/00* (2006.01)
*B23K 26/38* (2006.01)
*H01L 21/66* (2006.01)

(52) U.S. Cl.
USPC .............. 356/237.5; 356/399; 219/121.68; 219/121.72; 438/797; 438/463

(58) Field of Classification Search
USPC .......... 356/237.1–237.5, 399–401, 614–623; 219/121.68, 121.67, 121.72, 121.69; 438/463, 438/797, 795, 7

See application file for complete search history.

(56) References Cited

U.S. PATENT DOCUMENTS

| | | | | |
|---|---|---|---|---|
| 4,699,515 | A * | 10/1987 | Tanimoto et al. | 356/401 |
| 4,769,523 | A * | 9/1988 | Tanimoto et al. | 219/121.6 |
| 4,966,520 | A * | 10/1990 | Yokota et al. | 414/816 |
| 5,264,918 | A * | 11/1993 | Kagami | 356/400 |
| 7,945,410 | B2 * | 5/2011 | Morioka et al. | 702/81 |
| 2004/0002199 | A1 * | 1/2004 | Fukuyo et al. | 438/460 |
| 2007/0159630 | A1 * | 7/2007 | Opsal | 356/369 |
| 2007/0293032 | A1 * | 12/2007 | Kamimura | 438/597 |
| 2009/0140143 | A1 * | 6/2009 | Fukuda et al. | 250/311 |
| 2009/0148033 | A1 * | 6/2009 | Alumot et al. | 382/149 |
| 2009/0261083 | A1 * | 10/2009 | Osajima et al. | 219/121.72 |
| 2010/0219327 | A1 * | 9/2010 | Arbore et al. | 250/206 |

* cited by examiner

*Primary Examiner* — Hoa Pham
(74) *Attorney, Agent, or Firm* — William Park & Associates Patent Ltd.

(57) ABSTRACT

The present disclosure relates to laser processing and a laser processing apparatus for processing materials using laser. Processing performed after loading a wafer on a work stage and a laser processing apparatus for implementing such processing, among others, are disclosed. The laser processing includes loading a wafer on a work stage; determining the number of chips formed on the wafer loaded on the work stage, performing chip defect inspection and aligning the wafer while moving the work stage; measuring a height of a surface of the wafer loaded on the work stage using a displacement sensor; monitoring output power of a processing laser using a power meter; and shifting the work stage while irradiating a laser beam on the wafer to process the wafer.

17 Claims, 7 Drawing Sheets

FIG. 3A
FIG. 3B
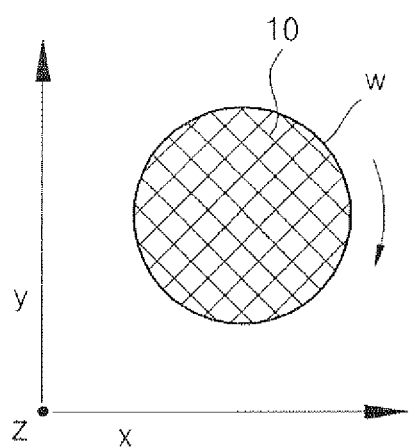
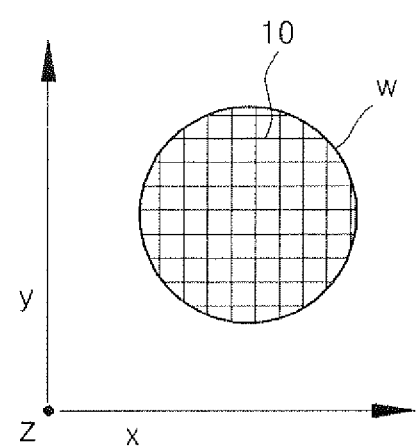

LASER PROCESSING METHOD AND LASER PROCESSING APPARATUS

BACKGROUND

1. Technical Field

The present disclosure relates generally to a laser processing method and a laser processing apparatus for processing materials using a laser and, more particularly, to a laser processing method after a wafer is loaded on a work stage and to a structure of a laser processing apparatus for implementing the method.

2. Description of the Related Art

Solid-state lasers are used to perform a variety of types of material processing including laser cutting and scribing. In recent years, solid-state lasers operating at ultraviolet (UV) wavelengths have been developed, thereby expanding the application range of lasers to semiconductor processing, particularly, a process of cutting a wafer for chip separation. Chip separation is required for a variety of substrates such as silicon wafers, compound semiconductor wafers, ceramic substrates, metallic substrates, glass substrates, etc.

BRIEF SUMMARY

A laser processing method capable of precisely processing a wafer using a laser for material processing, among others, according to an embodiment of the present invention is disclosed.

A laser processing apparatus capable of aligning a wafer on a work stage and transferring the wafer secured on the work stage in a desired direction, among others, according to an embodiment of the present invention is also disclosed.

A laser processing method includes: loading a wafer on a work stage; determining the number of chips formed on the wafer loaded on the work stage, performing chip defect inspection and aligning the wafer while moving the work stage; measuring a height of a surface of the wafer loaded on the work stage using a displacement sensor; monitoring output power of a processing laser using a power meter; and shifting the work stage while irradiating a laser beam on the wafer to process the wafer.

The method may further include adjusting a height of the work stage to allow a focal point of the laser to be positioned inside the wafer by shifting the work stage in a vertical direction (z-axis direction) before or after monitoring the power of the laser.

The work stage may be configured to allow rotation of the wafer while securing the wafer and alignment of the wafer may be carried out by rotating the wafer on the work stage to position a cutting-scheduled line of the wafer parallel to a horizontal shifting direction of the work stage.

A laser processing apparatus is adapted to focus a laser beam on a wafer to be processed via a lens and includes: a work stage connected to a vacuum unit and securing the wafer using negative pressure; an angle adjustor rotating the wafer on the work stage; a z-axis transfer unit adjusting a height of the work stage; and a horizontal transfer unit adjusting a horizontal position of the work stage.

The work stage may include a rotating plate rotatable on the work stage; a quartz chuck coupled to the rotating plate and including a suction orifice connected to the vacuum unit; an upper plate rotatably supporting the rotating plate; and a lower plate liftably supporting the upper plate.

The z-axis transfer unit may include a ball screw connecting centers of the upper and lower plates to each other, and a lift motor rotating the ball screw.

Additionally, the angle adjustor may include an angle adjusting motor driven in a clockwise or counterclockwise direction, and a belt connecting the angle adjusting motor to the rotating plate.

As such, according to an embodiment of the present invention, the laser processing method may place a wafer on a work stage and precisely process the wafer thereon.

According to an embodiment of the present invention, the laser processing method and apparatus may reduce a defect rate by monitoring output power of a processing laser immediately before processing the wafer using the laser.

Further according to an embodiment of the present invention, the laser processing method and apparatus may position a focal point of the laser beam inside the wafer through adjustment of a height of the work stage which secures the wafer.

BRIEF DESCRIPTION OF THE DRAWINGS

The above and other features of the present disclosure will become apparent from the detailed description of the following embodiments in conjunction with the accompanying drawings:

FIG. 3A-3B are conceptual views of a wafer aligning operation of the laser processing method in accordance with an embodiment of the present disclosure;

DETAILED DESCRIPTION

Exemplary embodiments of the present disclosure will now be described in detail with reference to the accompanying drawings.

It should be understood that the present disclosure is not limited to the following embodiments and may be embodied in different ways, and that the embodiments are given to provide complete disclosure of the invention and to provide thorough understanding of the present disclosure to those skilled in the art. The scope of the present disclosure is limited only by the accompanying claims and equivalents thereof.

A description of details apparent to those skilled in the art will be omitted herein for clarity.

Figure 1:
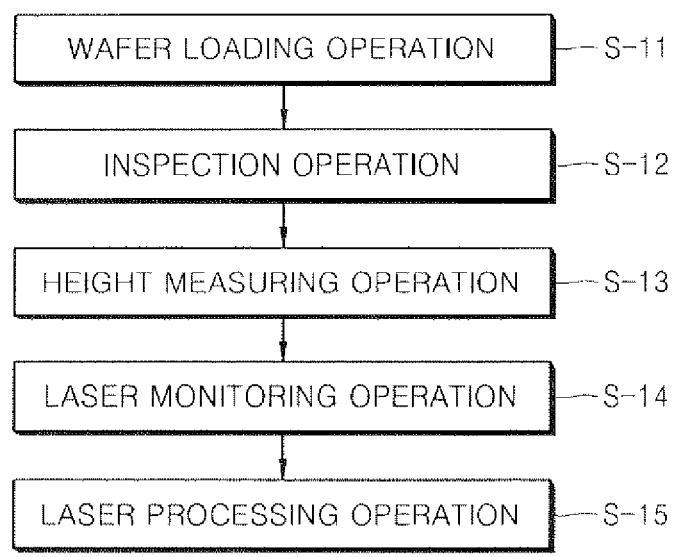
FIG. 1 is a flowchart of a laser processing method in accordance with an embodiment of the present disclosure.

FIG. 1 is a flowchart of a laser processing process in accordance with an embodiment of the present disclosure.

Referring to FIG. 1, the laser processing process according to an embodiment includes: loading a wafer on a work stage in a wafer loading operation S-11; determining the number of chips formed on the wafer loaded on the work stage, performing chip defect inspection and aligning the wafer while horizontally shifting or rotating the work stage in an inspection operation S-12; measuring the height of a surface of the wafer loaded on the work stage using a displacement sensor in a height measuring operation S-13; monitoring the output power of a processing laser using a power meter in a laser power monitoring operation S-14; and shifting the work stage while irradiating a laser beam on the wafer to process the wafer in laser processing operation S-15.

The wafers supplied for wafer processing are affixed to wafer rings, for example by using a blue tape, and the wafer rings having the wafers are accommodated in a cassette for processing in a wafer processing equipment.

Then, the wafer rings from the cassette are loaded one by one (or other predetermined number of wafer rings at a time) onto a work stage of the wafer processing machine by a transfer arm (not shown) or by other type of apparatus capable of performing the similar transferring task.

In the wafer loading operation S-11, the wafer ring having a wafer affixed thereto is placed on the work stage by a transfer arm.

In this operation S-11, the transfer arm may pick up a wafer ring by an edge of the wafer ring in contact with the transfer arm through vacuum adsorption so that the transfer arm may transfer the wafer ring to above the work stage and lower the wafer ring to bring the wafer ring into contact with the work stage while maintaining vacuum. Then, the vacuum is released from the transfer arm, and negative pressure is applied to a quartz chuck of the work stage so as to secure the wafer on the work stage.

In the inspection operation S-12, the number of chips formed on the loaded wafer is determined, a chip defect inspection is performed, and processing-scheduled lines are set. Then, the wafer is aligned so that the processing-scheduled lines are positioned parallel to a shifting direction of the work stage.

In the present disclosure, the term "alignment" or "aligning" or "aligned" used in connection with a wafer may also refer to "rotation" of or "rotating" or "rotated" wafer, respectively.

Figure 2:
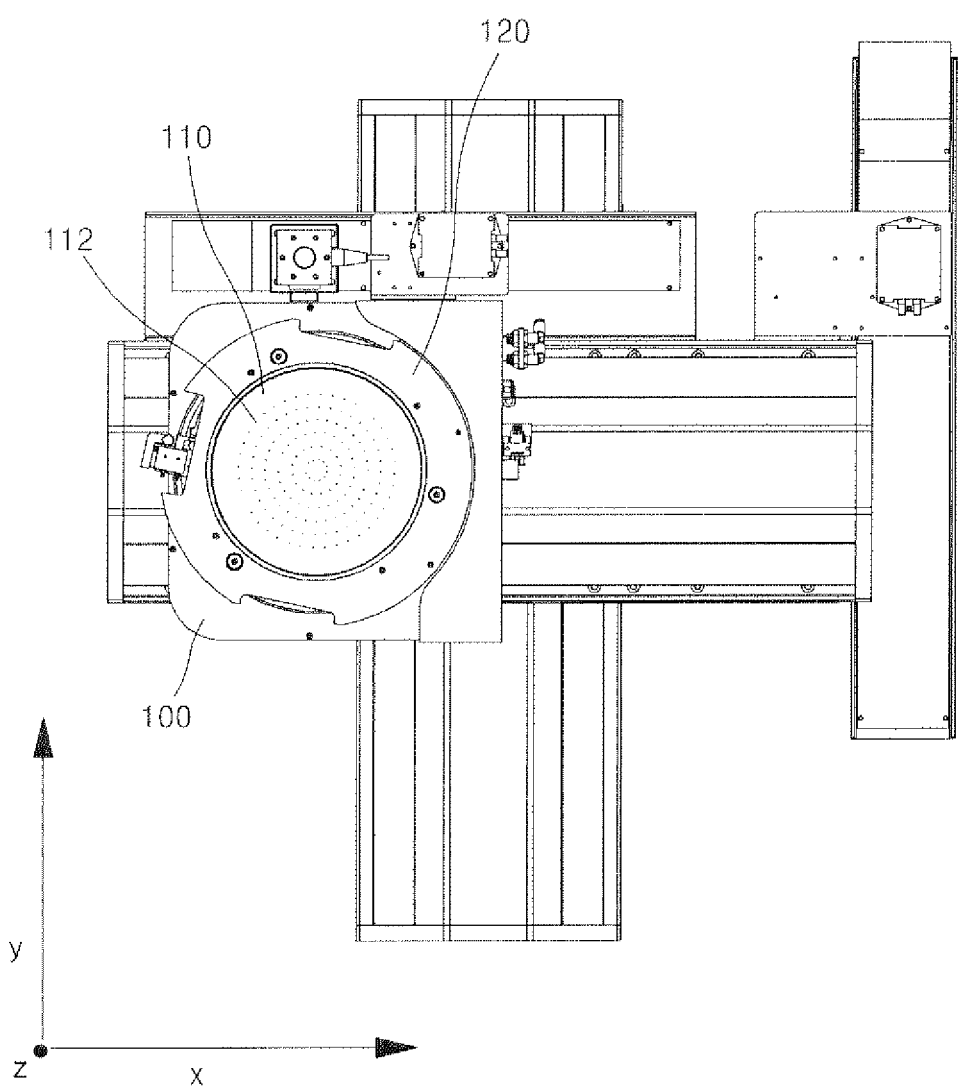
FIG. 2 is a top view of a work stage of a laser processing apparatus in accordance with an embodiment of the present disclosure.

FIG. 2 is a top view of a work stage 100 of a laser processing apparatus in accordance with an embodiment of the present disclosure.

The work stage 100 includes a rotating plate 120 on an upper surface thereof and a quartz chuck 110 disposed in the middle portion of the rotating plate 120. The quartz chuck 110 includes a plurality of suction orifices 112 that are connected to a vacuum unit such as a vacuum pump.

The work stage 100 is configured to be horizontally shifted in an X-axis direction and a Y-axis direction as shown in FIG. 2. A detailed structure of the work stage 100 will be described below with respect to FIGS. 3A-3B, which are drawn conceptually to show a wafer aligning operation of the laser processing process in accordance with an embodiment of the present disclosure.

A wafer W includes a plurality of chips that are separated from each other by a plurality of processing-scheduled lines 10. For example, a chip may be bordered by two pairs of parallel processing-scheduled lines 10 intersecting each other. The processing-scheduled lines 10 are set in the inspection operation S-12, in which the number of chips is determined and chip defect inspection is performed.

When the processing-scheduled lines 10 are set in the inspection operation S-12 such as that shown in FIG. 3A, it is checked to confirm whether one set of the processing-scheduled lines 10 is parallel to the X-axis direction and the other set of intersecting processing-scheduled lines 10 is parallel to the Y-axis direction. The work stage 100 is designed to move along X-axis or Y-axis direction in an embodiment of the present disclosure; however, different directions and/or other additional directions can also be possible for movement of the work stage 100. If the intersecting processing-scheduled lines 10 are not parallel to the X-axis and Y-axis directions, the work stage 100 is rotated to align the wafer W so as to position the processing-scheduled lines 10 parallel to the X-axis and Y-axis directions as shown in FIG. 3B.

In the height measuring operation S-13, the surface height of the wafer W secured on the work stage 100 is measured. The measured surface height of the wafer W is used to aid focusing of the processing laser on the wafer W.

Then, the work stage 100 is shifted in the z-axis direction to adjust the distance between the wafer surface and the processing laser in accordance with the measured surface height of the wafer W until the processing laser is adequately focused for performing tasks on the wafer surface.

Shifting the work stage 100 in the z-axis direction may be performed before or after the laser power monitoring operation S-14.

In the laser power monitoring operation S-14, prior to beginning a laser processing operation, the output from a laser oscillator is measured to determine whether or not the output level is within a proper range. If the output level not in the proper range, the laser output may be adjusted accordingly.

After verifying that the output level of the laser is within the proper range in the laser power monitoring operation S-14, a predetermined laser processing is performed on the wafer W along the processing-scheduled lines 10 by irradiating a laser beam onto the wafer W while shifting the work stage in the x-axis direction and/or the y-axis direction.

Here, the laser beam may be irradiated onto only the wafer W. Thus, it is desirable to perform an edge detecting operation before performing the wafer loading operation S-11 so that the wafer processing equipment may have accurately determined the size or dimensions of the wafer W.

In case the laser beam is irradiated outside the wafer, it could burn, for example, the blue tape and generate undesirable gases and contaminants.

In the laser processing operation S-15, the processing laser may be operated to irradiate a laser beam along the processing-scheduled lines 10 that were set on the wafer W secured to the work stage during the inspection operation S-12 and within the wafer area determined during the edge detection operation.

The processing laser is turned on/off in response to the movement of the work stage, so that the laser beam is not irradiated outside the wafer area.

The movement of the work stage is performed mainly in the horizontal direction (x-axis direction or y-axis direction) and may also be performed in the z-axis direction in consideration of lifting of the wafer due to inertia when the work stage is moved at high speed.

Figure 4:
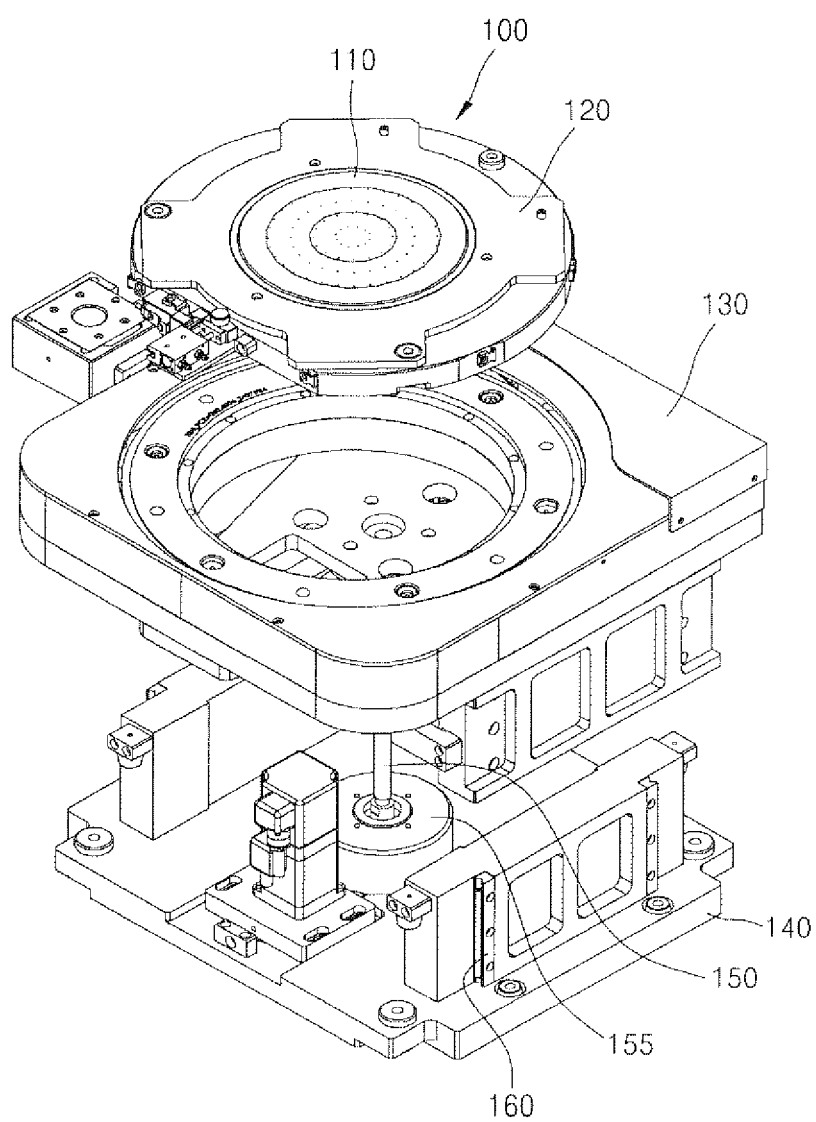
FIG. 4 is an exploded perspective view of the work stage of the laser processing apparatus in accordance with an embodiment of the present disclosure.

FIG. 4 is an exploded perspective view of a work stage 100 of a laser processing apparatus in accordance with an embodiment of the present disclosure.

The work stage 100 includes a rotating plate 120, a quartz chuck 110 disposed on an upper surface of the rotating plate 120, an upper plate 130 rotatably supporting the rotating plate 120, and a lower plate 140 liftably supporting the upper plate 130.

The quartz chuck 110 may be made of a transparent material and may include a plurality of suction orifices 112. The quartz chuck 110 may be made of a transparent material, so that it would make easier to verify clogging of the suction orifices 112 caused by foreign matter and/or to identify the presence of foreign matter on the quartz chuck 110.

The suction orifices 112 are connected to a vacuum source so that a wafer loaded on the work stage 100 can be securely held onto the surface of the quartz chuck 110 by vacuum.

The upper plate 130 and the lower plate 140 are connected to each other by a ball screw 150 such that the upper plate 130 can be raised or lowered in response to a forward or reverse rotation of a lift motor 155 operating the ball screw 150.

The upper plate 130 may be slidably connected to the lower plate 140 by a plurality of linear guides 160, which would assist smooth raising and lowering of the upper plate 130.

Further, the rotating plate 120 is rotatably mounted on the upper plate 130.

Figure 5:
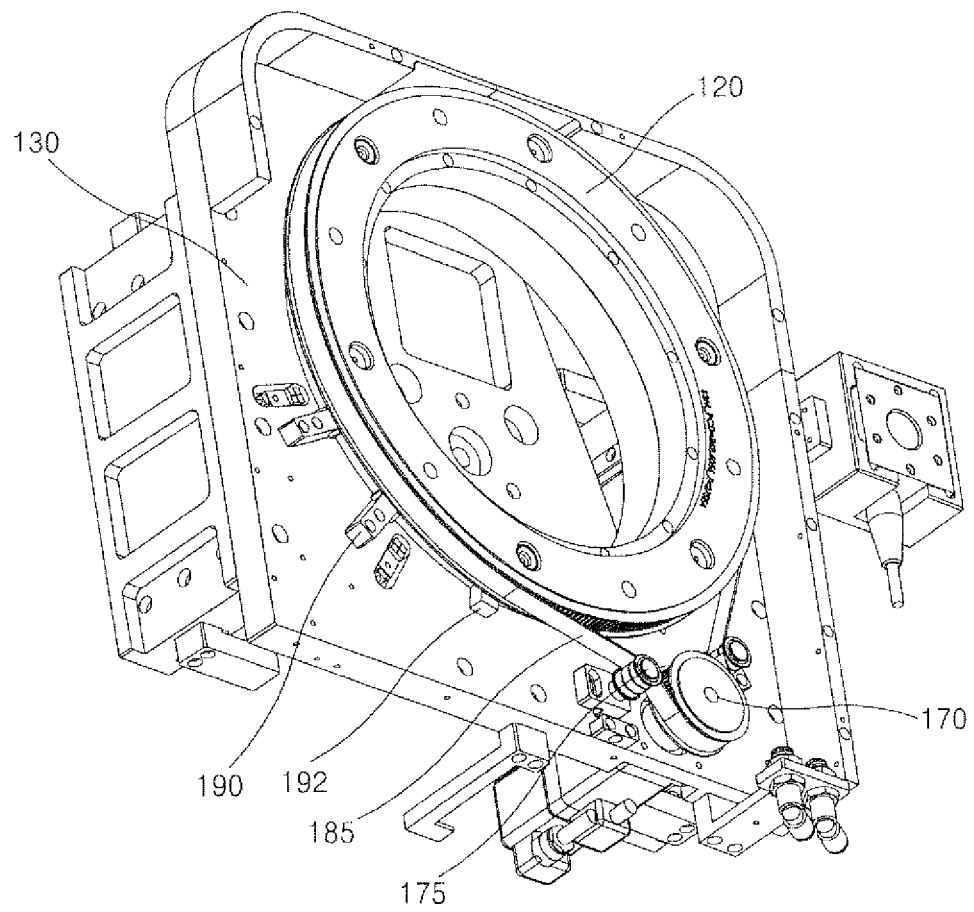
FIG. 5 is an internal configuration view of a rotating structure of the work stage in accordance with an embodiment of the present disclosure.

FIG. 5 is a perspective view of a rotating structure of the work stage 100 in accordance with an embodiment of the present disclosure.

Referring to FIG. 5, the rotating plate 120 may be doughnut shaped, and the quartz chuck 110 as shown in FIG. 4 can be coupled in the central region of the rotating plate 120. The rotating plate 120 is rotatably coupled to the upper plate 130.

Further, the rotating plate 120 is rotatable to any of predetermined angles by an angle adjusting motor 170, which is connected to the rotating plate 120 by a belt 185, based upon the forward or reverse rotation of the angle adjusting motor 170. When the rotating plate 120 is rotated, the quartz chuck 110 connected thereto is also rotated, such that the rotating plate 120 aligns the wafer that was securely held onto the quartz chuck 110.

The quartz chuck 110 is rotated so that the processing-scheduled lines 10 (see FIGS. 3A-3B) would coincide with a shifting direction of the work stage 100. The angle of rotation for the quartz chuck 110 may be set in the range of 95~105 degrees. Since the position of the quartz chuck 110 can be adjusted by positioning any one of the orthogonal processing-scheduled lines parallel to the shilling direction of the work stage, it is possible to coincide the processing-scheduled lines of the wafer with the shifting direction of the work stage regardless of the loading state of the wafer on the work stage 100, when the rotating angle of the quartz chuck 110 is, for example, within the range of 95~105 degrees.

The angle adjusting motor 170 may be provided with tension adjusting pulleys 175 at opposite sides thereof with respect to the angle adjusting motor 170 as shown in FIG. 5 to adjust the tension of the belt 185.

Further, the belt 185 may have protrusions formed on the inner surface thereof to ensure transmission of drive force. And the rotating plate 120 may be formed with grooves on the outer circumferential surface of the rotating plate 120 which contacts the belt 185 and in correspondence to the protrusions of the belt 185.

To prevent over-rotation of the rotating plate 120, the upper plate 130 may be provided with a stopper 190, and the rotating plate 120 may be provided with a projection 192, which would interfere with the stopper 190 to limit the rotation of the rotating plate 120.

Figure 6:
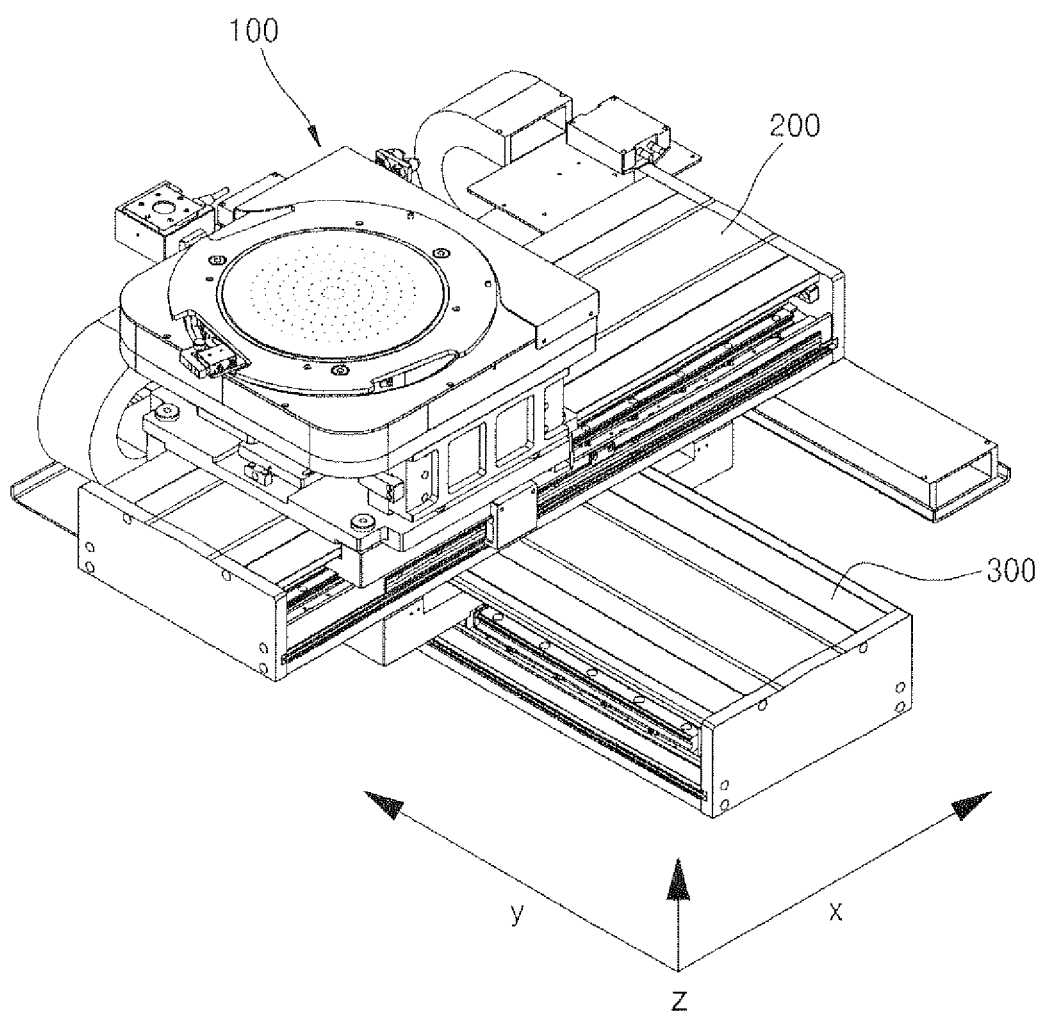
FIG. 6 is a perspective view of the work stage of the laser processing apparatus in accordance with an embodiment of the present disclosure.

FIG. 6 is a perspective view of the work stage 100 of a laser processing apparatus in accordance with an embodiment of the present disclosure.

Referring to FIG. 6, the laser processing apparatus is provided at an upper portion thereof with the work stage 100 slidable relative to a lateral (x-axis direction) frame 200, which is located below the work stage 100 and is also slidable relative to a longitudinal (y-axis) frame 300.

With this structure, the work stage 100 may be freely moved in the x-direction or y-direction through sliding motion of these components relative to one another.

Figure 7:
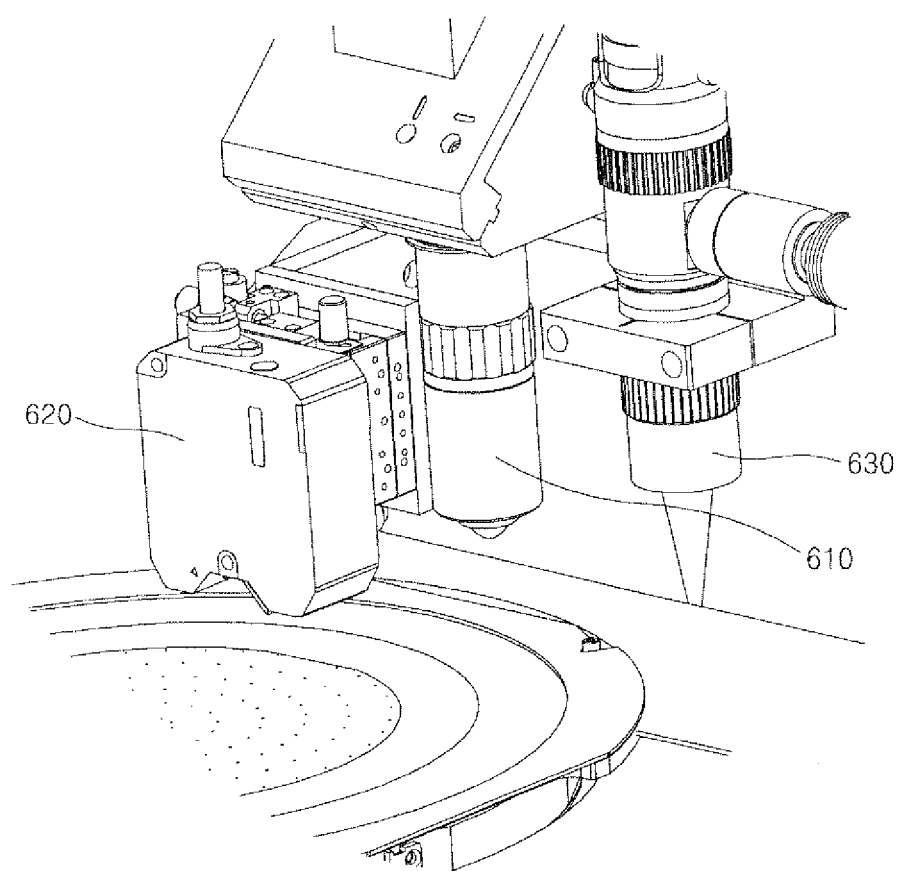
FIG. 7 is a partially enlarged schematic view of an objective lens of a laser disposed above the work stage in accordance with the embodiment of the present disclosure.

FIG. 7 shows an objective lens 610 of a processing laser disposed above the work stage 100 in accordance with an embodiment of the present disclosure.

The processing laser includes, inter alia, an objective lens 610, a displacement sensor 620, and an inspection camera 630. The objective lens 610 is disposed above the work stage 100 to focus a laser beam, and the inspection camera 630 is positioned around the objective lens 610.

The components of the processing laser are held in place while the work stage 100 is moved during laser processing.

The displacement sensor 620 according to an embodiment of the present disclosure may include a light emitting unit for emitting a laser beam for measurement and a light receiving unit for receiving the laser beam reflected by a target member; however, it should be understood that the displacement sensor 620 is not limited to this structure alone.

As such, according to various embodiments, the laser processing apparatus is configured to allow a work stage such as 100 to move along the three axes while allowing the work stage to be rotated in place with respect to a center of a wafer loaded on the work stage, thereby enabling alignment and precise processing of the wafer on the work stage.

Although some embodiments have been described in the present disclosure, it should be understood that the embodiments are given by way of illustration only and do not limit the scope of the present disclosure, and that various modifications and changes can be made by a person having ordinary knowledge in the art without departing from the spirit and scope of the present disclosure, which are limited only by the accompanying claims and equivalents thereof.

What is claimed is:

1. A laser processing method comprising:
    loading a wafer on a work stage movable in one or more planar directions;
    determining the number of chips formed on the wafer loaded on the work stage;
    performing chip defect inspection and positioning the wafer while moving the work stage in one or more planar directions, such that the wafer is positioned for alignment in the planar directions to position a cutting-scheduled line of the wafer parallel to a predetermined planar direction through which the work stage is movable;
    focusing a laser source based on the distance between a surface of the wafer loaded on the work stage and the laser source;
    monitoring output power level of the laser source; and
    moving the work stage while irradiating a laser beam on the wafer to process the wafer by cutting through the wafer along the cutting-scheduled line.

2. The method according to claim 1, further comprising:
    moving the work stage in a vertical direction perpendicular to the planar directions to allow a focal point of the laser to be positioned on the wafer before or after monitoring the output power level of the laser.

3. The method according to claim 1, wherein the loading of the wafer comprises attachably holding the wafer on the work stage using negative pressure.

4. The method according to claim 1 further comprising:
    detecting an outer edge of the wafer secured to a wafer ring before loading the wafer on the work stage.

5. The method according to claim 4, wherein the laser beam is prevented from being irradiated on an area outside the detected outer edge of the wafer.

6. A laser processing apparatus having a laser beam focusable on a wafer, comprising:
    a work stage capable of securing the wafer using negative pressure;

an angle adjustor rotating the wafer on the work stage for alignment with a predetermined one of planar directions, such that the wafer is positioned for alignment in the planar directions to position a cutting-scheduled line of the wafer parallel to a predetermined planar direction through which the work stage is movable;

a z-axis transfer unit adjusting a height of the work stage in a direction perpendicular to the planar directions; and a horizontal transfer unit adjusting the position of the work stage along one or more planar directions such that the laser beam cuts through the wafer along the cutting-scheduled line.

7. The apparatus according to claim 6, wherein the work stage comprises:

a rotating plate;

a quartz chuck coupled to the rotating plate and including a suction orifice connected to a vacuum unit connected to the work stage for creating the negative pressure;

an upper plate rotatably supporting the rotating plate; and a lower plate liftably supporting the upper plate in the vertical direction perpendicular to the planar directions.

8. The apparatus according to claim 7, wherein the z-axis transfer unit comprises a ball screw connecting centers of the upper and lower plates to each other, and a lift motor rotating the ball screw.

9. The apparatus according to claim 8, further comprising:

a linear guide connecting the upper plate to the lower plate.

10. The apparatus according to claim 6, wherein the angle adjustor comprises an angle adjusting motor driven in a clockwise or counterclockwise direction, and a belt connecting the angle adjusting motor to the rotating plate.

11. The apparatus according to claim 10, further comprising:

tension adjusting pulleys disposed at opposite sides of the angle adjusting motor to adjust tension of the belt.

12. The apparatus according to claim 11, wherein the upper plate is formed with a stopper and the rotating plate is formed with a projection which interferes with the stopper to restrict a rotating range of the rotating plate.

13. The apparatus according to claim 6, wherein the horizontal transfer unit comprises a lateral frame and a longitudinal frame which move the work stage in directions orthogonal to each other.

14. The apparatus according to claim 6, further comprising:

a power meter measuring output power level of a processing laser from which the laser beam is irradiated.

15. The apparatus according to claim 6, further comprising:

an inspection camera photographing a surface of the wafer loaded on the work stage.

16. The apparatus according to claim 6, further comprising:

a displacement sensor measuring a height of a surface of the wafer loaded on the work stage.

17. The apparatus according to claim 16, wherein the displacement sensor includes a light emitting unit emitting a laser beam for measurement and a light receiving unit receiving the laser beam reflected by the wafer.

* * * * *